United States Patent [19]

Brennesholtz

[11] Patent Number: 5,009,930
[45] Date of Patent: Apr. 23, 1991

[54] METHOD FOR FORMING A DEPOSITED LAYER ON A SKIRTED SUBSTRATE

[75] Inventor: Matthew S. Brennesholtz, Waterloo, N.Y.

[73] Assignee: North American Philips Corporation, New York, N.Y.

[21] Appl. No.: 448,033

[22] Filed: Dec. 8, 1989

[51] Int. Cl.$^5$ .......................... B05D 7/22; C23C 16/04
[52] U.S. Cl. ...................................... 427/236; 427/69; 427/166; 427/237; 427/238; 427/255; 427/255.5; 427/282
[58] Field of Search .................. 427/69, 70, 107, 109, 427/166, 167, 255, 255.5, 248.1, 282, 236, 237, 238; 118/720

[56] References Cited
U.S. PATENT DOCUMENTS
4,380,212  4/1983  Kraus ................................ 427/255.5

Primary Examiner—Evan Lawrence
Attorney, Agent, or Firm—John C. Fox

[57] ABSTRACT

A method whereby the thickness distribution of a vapor deposited layer, such as an interference filter deposited on a skirted substrate such as a glass faceplate for a projection television tube, is improved by shielding the substrate from indirect flux of vapor so as to reduce the shadowing effect of the skirt upon the thickness distribution of the deposited layer, thereby improving the white field uniformity of the resultant projection image.

8 Claims, 7 Drawing Sheets

METHOD FOR FORMING A DEPOSITED LAYER ON A SKIRTED SUBSTRATE

CROSS REFERENCE TO RELATED APPLICATIONS

Copending U.S. Patent Application Ser. No. 340,835, filed Apr. 20, 1989, now U.S. Pat. No. 4,942,063, and U.S. Patent Application Ser. No. 400,198, filed Aug. 29, 1989, relate to methods and apparatus for controlling the thickness distribution of a deposited layer on a substrate using a rotating dodger and a variable transmission mask, respectively.

BACKGROUND OF THE INVENTION

This invention relates to deposition of material onto a skirted substrate, and more particularly, relates to a method and apparatus for reducing the shadowing effect of the skirt on the thickness distribution of the deposited layers along the plane of the substrate.

U.S. Pat. No. 4,683,398 describes a cathode ray tube for projection color television having a multi-layer interference filter between the glass faceplate and the luminescent screen. Such a filter results, among other things, in significantly greater brightness of the luminescent output of the tube.

Such interference filters are typically composed of alternating layers of materials having a high and a low index of refraction, respectively. The layers are preferably formed by vapor deposition onto the inner surface of the glass faceplate.

Mass production of such filters is carried out in a vacuum chamber containing the source materials to be evaporated, means for heating the source materials, and a dome-shaped fixture adapted for holding a multiplicity of glass faceplates. The plates are arranged in rows, each row forming a circle around the dome, so that each plate is approximately equidistant with the other plates from the source materials.

The dome is rotated during deposition, not only to promote uniform distribution of the deposited material on the plates, but also to pass the plates behind one or more dodgers located between the source materials and the plates. These dodgers are designed to result in increasing thickness of the layers toward the edges of the plates, which has been shown to result in even greater increases in brightness than can be obtained for a uniform thickness distribution.

These glass faceplates often are fabricated with a peripheral upstanding wall, termed a "skirt". After deposition of the filter and formation of the luminescent screen on the inner surface of the faceplate, the edge of the skirt is then sealed to a matching edge of a glass funnel containing an electron gun in order to form the envelope of the projection tube.

The presence of the skirt causes a problem during filter deposition when there is a significant partial pressure of gas inside the vacuum chamber. Molecules evaporated from the source can be scattered by molecules in the gas, thereby becoming new sources. The skirt of the plate shadows a portion of the plate from these new sources of material, reducing the amount of material deposited in the shadowed region relative to the exposed areas of the faceplate and thus altering the thickness distribution of the filter layer from that desired.

OBJECTS AND SUMMARY OF THE INVENTION

Accordingly, it is an object of the invention to reduce the shadowing effect of the skirt on the thickness uniformity of a skirted substrate such as a glass faceplate for a projection television tube, thereby to improve the thickness uniformity of the deposited layers and consequently the white field uniformity of the resultant projection image.

In accordance with the invention, the shadowing effect of a skirted substrate upon the thickness uniformity of layers deposited on the substrate is reduced by providing shields between the primary source of material to be deposited and the substrate in order to at least partially shield the substrate from secondary sources of deposition material located outside the path of unscattered particles from the primary source to the substrate, during deposition.

In accordance with a preferred embodiment of the invention the primary source of material is located substantially at or near an axis normal to the substrate surface, and the shields at least partially surround the region of direct "unscattered" flux of particles from the source to the substrate.

In accordance with another preferred embodiment, additional shields are provided within the path of direct flux to provide additional shielding of the substrate from secondary sources of particles located outside the path of direct flux, as well as to provide collimation of the beam of direct flux particles.

Such shields are preferably located during deposition so as to form extensions of the skirt, extending from the vicinity of the skirt edge toward the direct source of material.

In accordance with another aspect of the invention, an apparatus is provided for carrying out the above method, the apparatus comprising a vacuum chamber containing at least one source material and means for heating the source material to vaporize it; means for holding a plurality of skirted substrates in positions approximately equidistant from the source material, and means for at least partially shielding the path of direct flux of vapor, so that during deposition the shadowing effect of the skirt of the substrate is reduced.

In a preferred embodiment of the apparatus, means are provided for moving the substrates, comprising a rotatably mounted dome-shaped fixture, the fixture adapted for holding the substrates in one or more circular rows and for moving the substrates in these circular rows above the source material.

DESCRIPTION OF THE PREFERRED EMBODIMENTS

Figure 1:
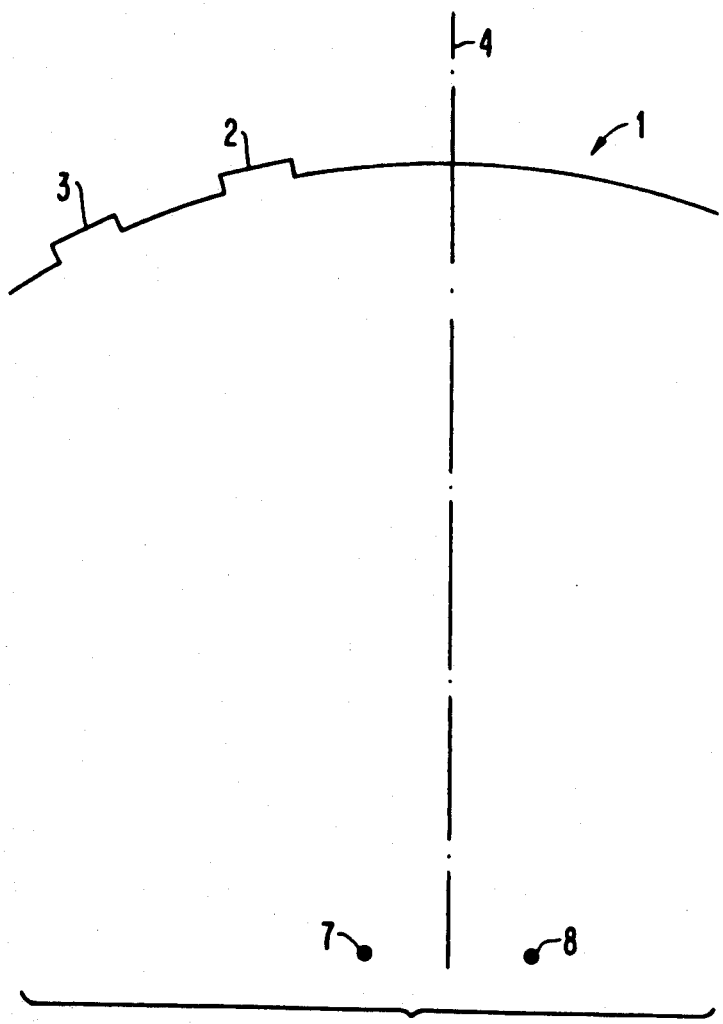
FIG. 1 is a diagrammatic representation of the positional relationship between source material and substrates in one embodiment of a vapor deposition apparatus of the prior art.

FIG. 1 shows the positional relationship between source material and substrates in a vapor deposition apparatus of the prior art. Dome-shaped fixture 1 holds substrates 2 and 3 in positions which are approximately equidistant from source materials 7 and 8. Fixture 1 rotates about an axis 4, moving the substrates in a circular path above the source materials.

In the application envisioned for the invention, the substrates are glass face plates for cathode ray tubes for projection television, and the source materials are usually oxides of silicon and titanium or tantalum, which are deposited on the inner surfaces of the substrates in alternate layers. Oxidation is completed to form an interference filter of alternating layers of $SiO_2$ and $TiO_2$ or $SiO_2$ and $Ta_2O_3$, having low and high indices of refraction respectively.

In this application, the ability to control the thickness distribution of the filter layers across the faceplate enables the optimization of certain operating characteristics of the projection tubes such as lumen output to the projection optics.

Figure 2:
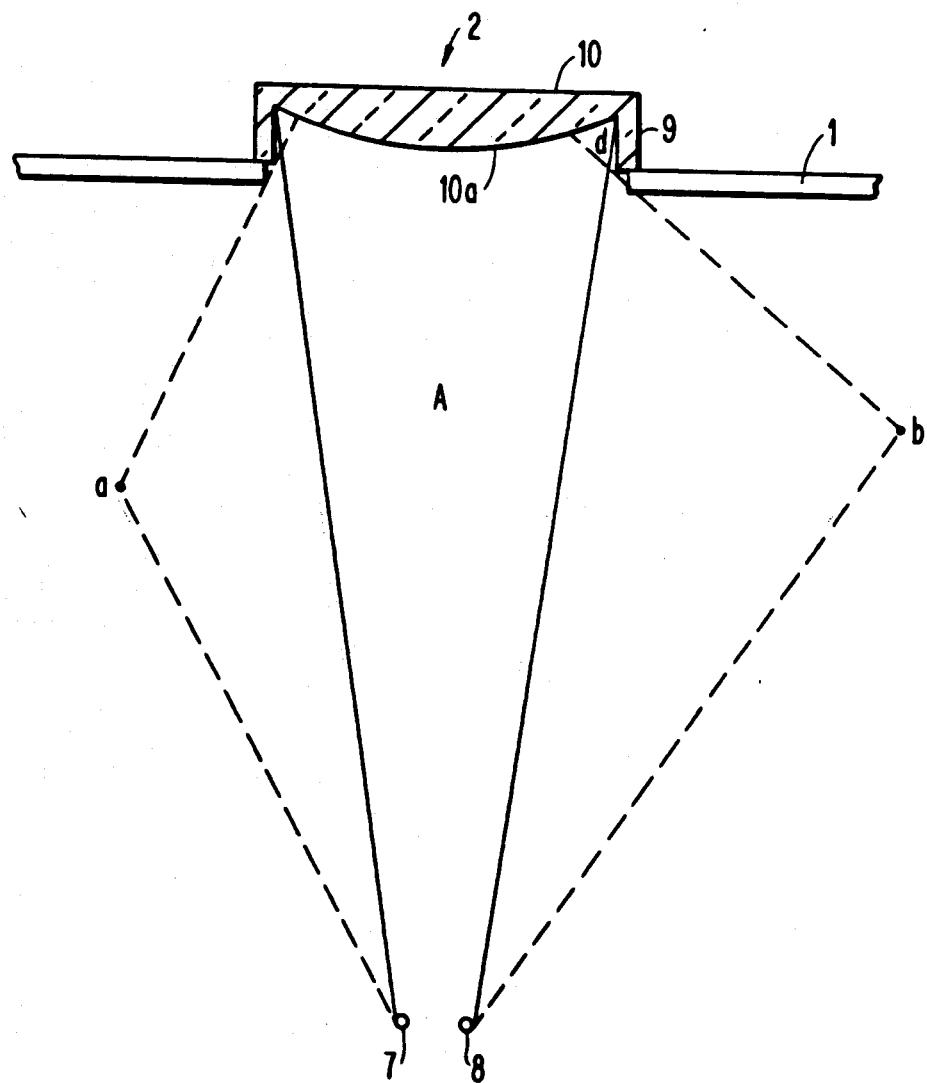
FIG. 2 is a diagrammatic representation of the relationship between a skirted substrate and source material illustrating the shadowing effect of such an arrangement of the prior art.

FIG. 2 shows a detail of the arrangement of FIG. 1 in which substrate 2 is seen to be a skirted faceplate for a cathode ray tube having an upstanding sidewall or skirt 9 surrounding the periphery of the faceplate 10. The interference filter and luminescent screen are deposited upon the inner curved surface 10a. Area A between sources 7 and 8 and the substrate surface 10a represents the area in which molecules evaporated from the sources reach the substrate surface 10a without being scattered by other molecules, referred to herein as the area of direct flux. However, other molecules evaporated from the source can be scattered by molecules in the gaseous environment of the vapor deposition apparatus, for example, giving rise to indirect sources of deposition. Such indirect sources, represented in FIG. 2 as points a and b, give rise to deposition paths represented by the dashed lines which, due to the presence of the skirt 9, cannot be deposited in the corner regions, represented in the figure by c and d. This shadowing effect reduces the thickness of the vapor deposited filter layers in the corner regions of the faceplate. This indirect or scattered flux can be on the order of five to ten percent of the direct flux which in a multilayer interference filter of, for example, 14 to 20 layers can have a noticeable effect upon the white field uniformity of the resultant projection image.

Figure 3:
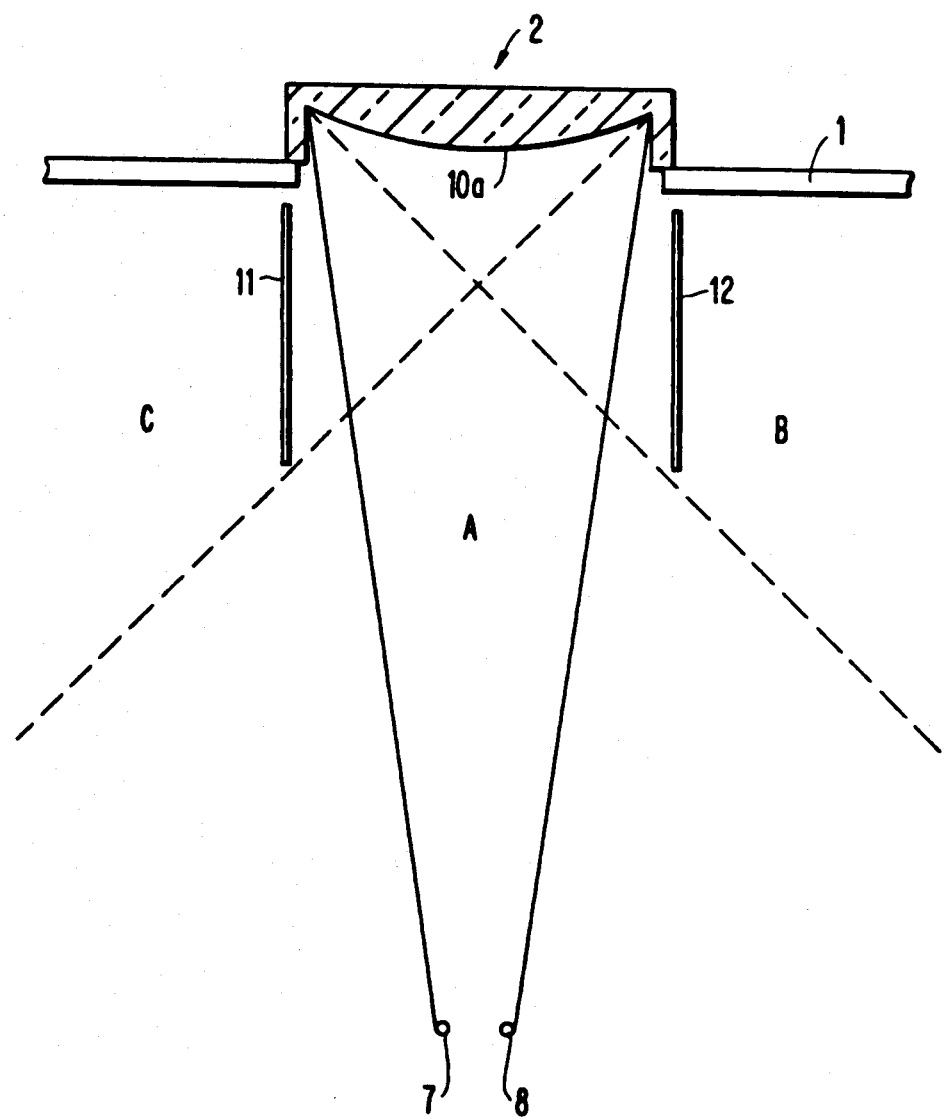
FIG. 3 is a diagrammatic representation similar to that of FIG. 2 showing the reduction of the shadowing effect by the placement of shields in accordance with the invention.
Figure 5:
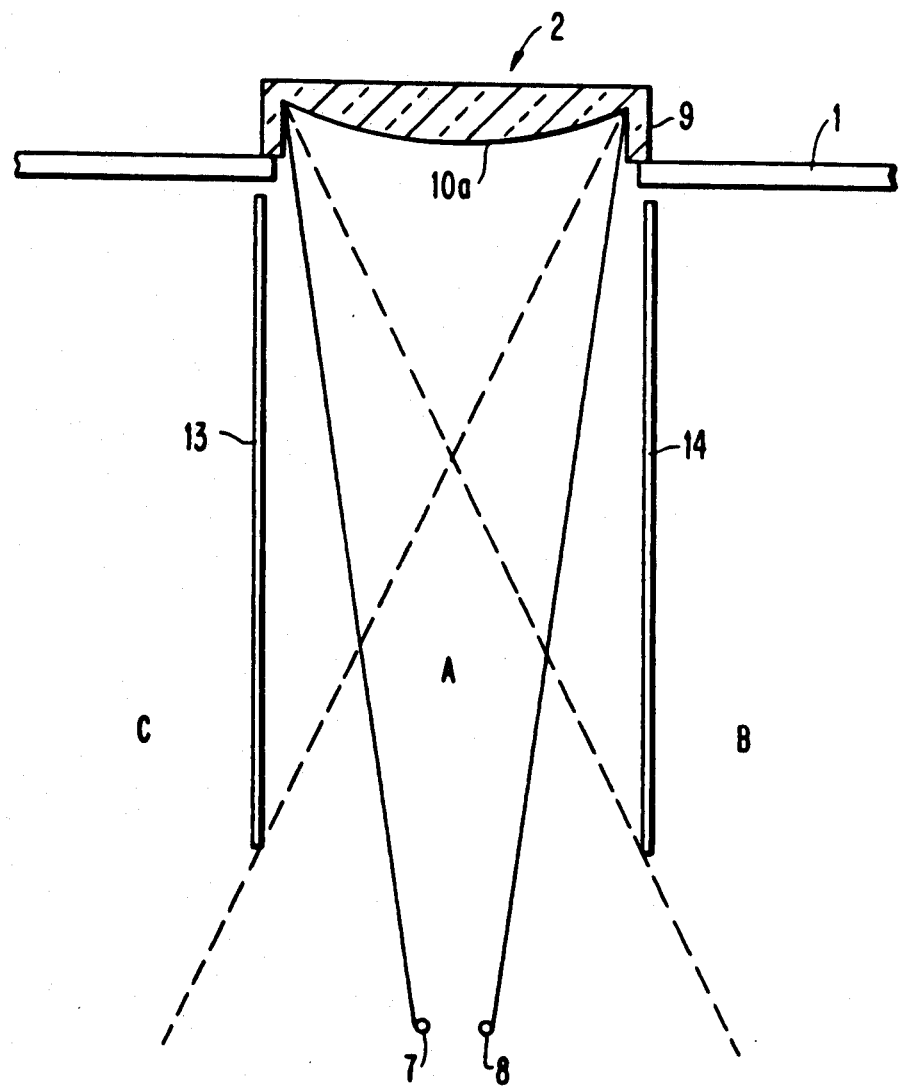
FIG. 5 is a diagrammatic representation similar to that of FIG. 3 showing another embodiment of the shields of the invention.

Referring now to FIG. 3, an arrangement similar to that of FIG. 2, except that baffles or shields 11 and 12 have been placed adjacent the area A of direct flux, effectively shadowing the entire inner surface 10a of the substrate from all indirect flux occurring in areas B and C above the dashed lines. Further shielding of the indirect flux may be obtained simply by lengthening shields 11 and 12 so that areas b and c are increased as shown in FIG. 5 for shields 13 and 14.

Since the scattered flux is a portion of the total flux, eliminating the scattered flux will increase evaporation time proportionately, by an estimated five to ten percent. This may be compensated for, for example, by increasing the evaporation rate of the material from sources 7 and 8.

Figure 4:
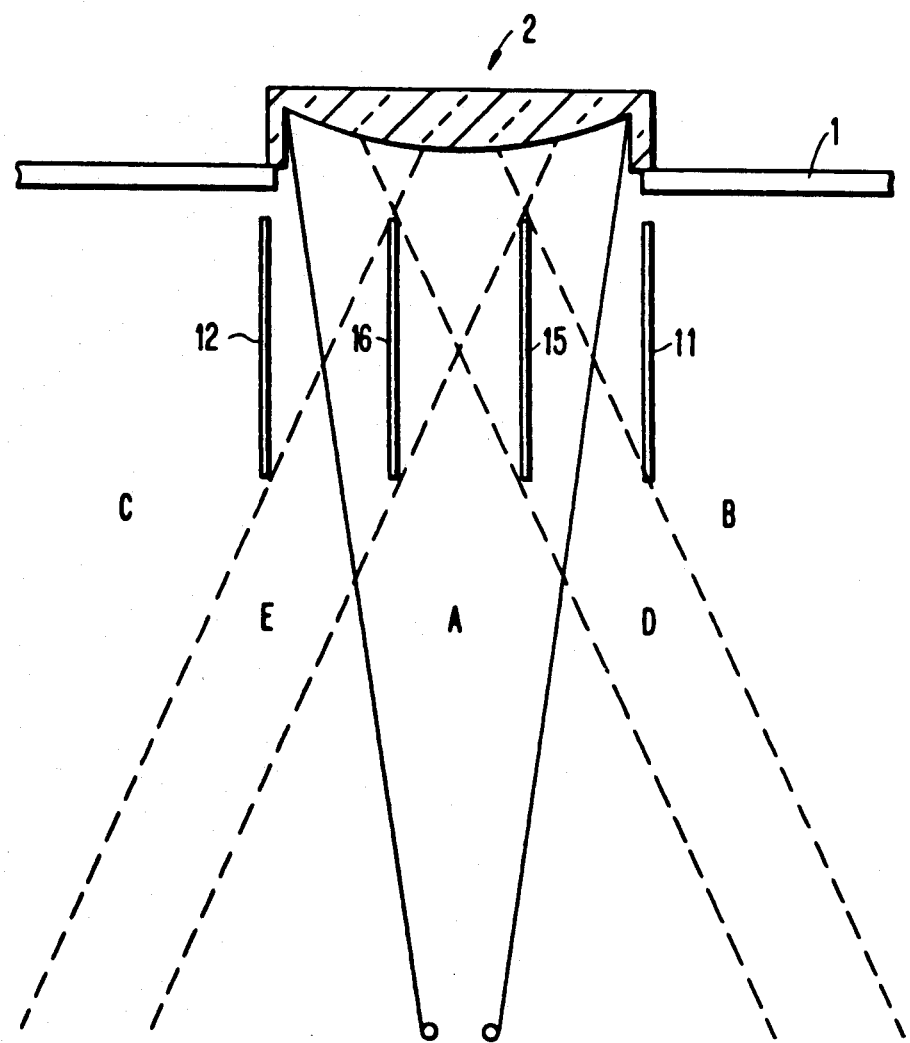
FIG. 4 is a diagrammatic representation similar to that of FIG. 2 in which additional, collimating shields have been provided.

Another embodiment of the invention is shown in FIG. 4 in which additional shields 15 and 16 are placed adjacent shields 11 and 12 within the area A of direct flux. These additional shields 15 and 16 not only provide partial shielding of indirect flux in the areas D and E, but also provide a collimating effect to further improve the distribution of the flux, and thus the thickness distribution of the vapor deposited layers. These shields are preferably made sufficiently thin that they do not cast noticeable shadows on the substrate. As will be appreciated, this combined shielding-collimating effect can be further enhanced by the addition of further shields.

Where the substrates are moved, e.g., rotated above the source material, during deposition, the shields can either be mounted to the rotating fixture 1, in which case they maintain a fixed relationship with the substrates, or mounted to the vacuum enclosure, in which case the rotating substrates pass by the shields.

Where dodgers are used to control the thickness distribution of the deposited layers, it is preferable to mount the shields to the enclosure, where they can be of suitable length without interfering with the dodgers.

Figure 6:
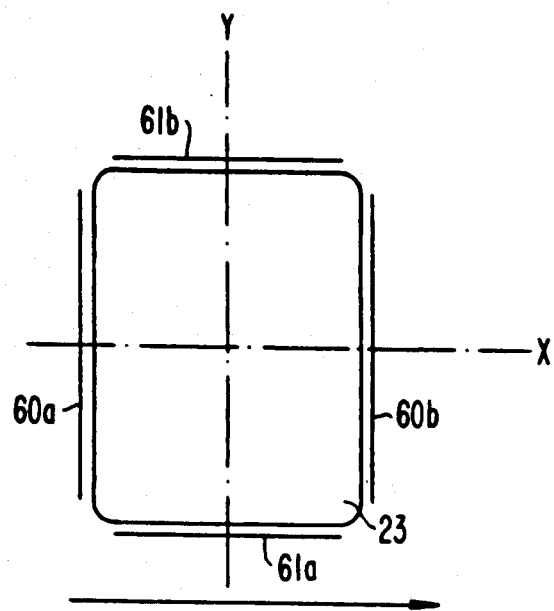
FIG. 6 is a diagrammatic representation of the relationship between a moving skirted substrate and two pairs of shields as viewed from the source in accordance with the invention.

FIG. 6 shows a substrate as viewed from the position of the source materials 7 and 8. This substrate 23 is a glass faceplate which is rectangular in shape. The long axis of the faceplate is conventionally referred to as the major axis, which in this figure corresponds to the Y axis. The short axis is the minor axis and here corresponds to the X axis, which in an apparatus of the type shown in FIG. 1 represents the circular path of travel of the substrate caused by the rotation of fixture 1, as viewed in the plane of the circle. The direction of travel is indicated by the arrow in FIG. 6.

In this arrangement, two pair of shields 60a and b and 61a and b are attached to fixture 1 and thus follow the substrate 23, maintaining a fixed relationship during rotation about axis 4.

Shields may be attached to the wall of the enclosure rather than the rotating fixture 1. In this case, the shields should form a complete or nearly complete ring in a circle so that as a substrate moves in a circle it is always shielded. The advantage of this arrangement is that the shields do not print into the filter, even though they cover part of the active area, as long as care is taken to ensure no portion of the shield is circumferential.

Figure 7A:
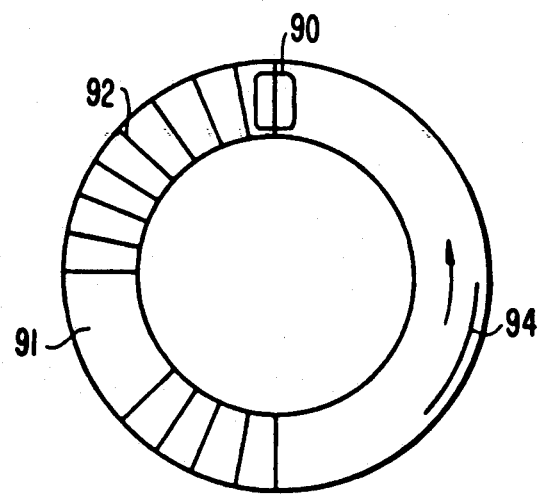
FIGS. 7A and 7B are diagrammatic plan views of two other embodiments of the invention in which a skirted substrate moves in a circular path above the shields.

In FIG. 7A, radial shields 92 are shown. These may form a complete ring or a ring with one or more gaps 91 for the positioning of fixed or moving dodgers. The substrate 90 moves in a circle behind the shields and is protected from the edge effect along edges that have a vector decomposition that includes an edge parallel to the shields.

Figure 7B:
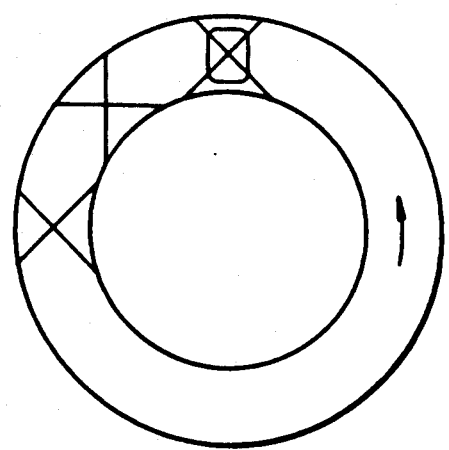

Radial shields 92 will protect the edge that is parallel to the major axis when fixture 1 is designed to hold a maximum number of rectangular substrates. Circumferential shields such as 94 to protect the minor axis edges should in general be avoided because they would tend to print into the filter. In FIG. 7B, shields with an X pattern, have a vector decomposition with components parallel to both the major and minor edges and thus tend to protect both edges from the skirt effect.

Of course other variations of shields will become apparent to those skilled in the art. For example, in the arrangement of FIG. 6 the two pairs of shields may be replaced by a single continuous shield having the appearance of a stove pipe of rectangular or other cross section. Cross-hatched vanes in a square, rectangular, hexagonal or other pattern to provide shielding and collimating of the material flux in both the X and Y directions may be employed.

Figure 8:
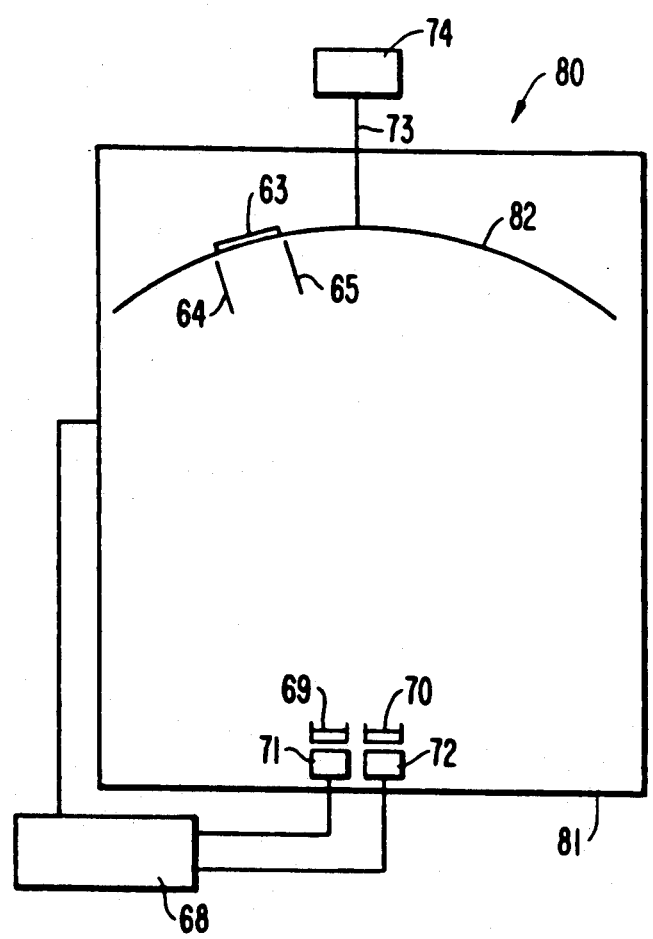
FIG. 8 is a diagrammatic representation of a vapor deposition apparatus of the invention.

A suitable apparatus 80 for carrying out the method of the invention is shown schematically in FIG. 8. The vacuum enclosure 81 contains the rotating collet 82. The collet is supported by a shaft 73 and rotated by a motor 74 located outside the vacuum chamber 81. Collet 82 holds at least one substrate 63 having a surface exposed to the interior of the enclosure. Shields 64 and 65 are mounted on collet 82 between substrate 63 and sources 69 and 70. The sources are heated to evaporation temperatures by separate heaters 71 and 72, typically using electron heating means.

While this invention has been described largely in terms of vapor deposition, it is applicable wherever material is desired to be deposited with a controlled thickness distribution on a substrate, with the material travelling ballistically in substantially straight lines. Applications where this occurs include:

1. vacuum and near vacuum application of multilayer and single layer optical filters;
2. ion-assisted deposition of multilayer and single layers filters;
3. chemical vapor deposition at reduced pressures; and
4. paint spraying and dusting applications.

Other embodiments and variations of embodiments of the invention will become apparent to those skilled in the art, and these are intended to be encompassed within the scope of this description in the appended claims.

What is claimed is:

1. A method for reducing the shadowing effect of the skirt of a skirted substrate on the thickness uniformity of a deposited layer on the substrate, said skirt extending in the direction of a primary source of deposited material, the method comprising:

providing at least one shield between the primary source of the deposited material and the substrate to at least partially shield the substrate from secondary indirect sources of deposited material located outside the area of direct flux of the particles from the primary source to the substrate, during deposition.

2. The method of claim 1 in which the primary source of deposited material is located substantially on or near an axis normal to the substrate surface, and the shields surround at least a portion of the area of direct flux.

3. The method of claim 2 in which the shields extend from the vicinity of the skirt edge toward the source.

4. The method of claim 1 in which additional shields are placed within the area of direct flux to both partially shield the substrate from indirect flux of deposition material, as well as to collimate the beam of particles in the region of direct flux.

5. The method of claim 4 in which there is relative motion between the substrates and the shields during deposition.

6. The method of claim 5 in which the substrate moves in a circular path, and the shields are distributed along the path.

7. The method of claim 6 in which the shields are arranged substantially radially.

8. The method of claim 6 in which the shields form a pattern that includes both radial and circumferential vector components.

* * * * *